United States Patent
Hsiao (10) Patent No.: US 7,529,331 B2
(45) Date of Patent: May 5, 2009

(54) WOBBLE CLOCK GENERATOR AND DRIVING METHOD THEREOF

(76) Inventor: Yuan-Kun Hsiao, 8F, No. 533, Chung-Cheng Rd., Hsin-Tien City, Taipei Hsien (TW)

( * ) Notice: Subject to any disclaimer, the term of this patent is extended or adjusted under 35 U.S.C. 154(b) by 617 days.

(21) Appl. No.: 10/709,004

(22) Filed: Apr. 7, 2004

(65) Prior Publication Data

US 2005/0018801 A1    Jan. 27, 2005

Related U.S. Application Data

(60) Provisional application No. 60/461,578, filed on Apr. 10, 2003.

(51) Int. Cl.
H03D 3/24 (2006.01)

(52) U.S. Cl. .................. 375/376; 375/254; 375/294; 375/327; 375/354; 375/373; 369/47.1; 369/47.22; 369/59.22

(58) Field of Classification Search ......... 375/135–136, 375/240.28, 354, 371, 145–147, 224–226, 375/294, 355, 327, 373–376; 369/47.22, 369/47.32, 59.22, 275.3, 275.4; 327/165
See application file for complete search history.

(56) References Cited

U.S. PATENT DOCUMENTS

| | | | |
|---|---|---|---|
| 4,999,824 A | 3/1991 | Fuji et al. | |
| 5,475,666 A | 12/1995 | Ito et al. | |
| 5,689,482 A | 11/1997 | Iida | |
| 5,939,947 A | 8/1999 | Nakao et al. | |
| 6,088,307 A | 7/2000 | Fushimi | |
| 6,285,219 B1 | 9/2001 | Pauls | |
| 6,333,902 B1 | 12/2001 | Shim | |
| 6,345,023 B1 | 2/2002 | Fushimi et al. | |
| 6,587,417 B2 * | 7/2003 | Okamoto et al. | ......... 369/59.22 |
| 6,661,752 B2 | 12/2003 | Eom | |
| 6,754,147 B2 * | 6/2004 | Hsu et al. | ................ 369/47.28 |
| 6,765,861 B2 * | 7/2004 | Van Vlerken et al. | .... 369/275.4 |
| 6,785,207 B2 | 8/2004 | Nishimura et al. | |
| 6,891,785 B2 | 5/2005 | Yamamoto et al. | |
| 6,956,800 B2 | 10/2005 | Tanaka | |

(Continued)

FOREIGN PATENT DOCUMENTS

CN    1373474 A    10/2002

(Continued)

*Primary Examiner*—Shuwang Liu
*Assistant Examiner*—Hirdepal Singh
(74) *Attorney, Agent, or Firm*—Perkins Coie LLP (57) ABSTRACT

A wobble clock generator with a protective mechanism that can avoid interference generated from a phase-modulated wobble signal. The wobble clock generator has an arithmetic/logic circuit and a phase-locked loop. The arithmetic/logic circuit calculates a period count value by counting a period of a wobble signal according to a reference clock, and compares an average value with the period count value for outputting a control signal. The phase-locked loop is electrically connected to the arithmetic/logic circuit for generating a wobble clock according to the control signal and the wobble signal. When the control signal corresponds to a first logic level, the phase-locked loop compares the wobble signal with the wobble clock to drive the wobble clock to be synchronized with the wobble signal. When the control signal corresponds to a second logic level, the phase-locked loop holds the wobble signal without synchronizing the wobble clock with the wobble signal.

20 Claims, 7 Drawing Sheets

U.S. PATENT DOCUMENTS

| | | | |
|---|---|---|---|
| 7,003,065 B2 | 2/2006 | Homol et al. | |
| 7,016,277 B2 * | 3/2006 | Chou et al. | 369/47.28 |
| 7,039,380 B2 * | 5/2006 | Jahene et al. | 455/260 |
| 7,046,598 B2 * | 5/2006 | Eom | 369/47.48 |
| 7,053,919 B2 | 5/2006 | Nagano | |
| 7,190,906 B2 | 3/2007 | Cao | |
| 7,375,592 B2 * | 5/2008 | Skerritt | 331/16 |
| 2002/0027966 A1 | 3/2002 | Fukuhara | |
| 2002/0131347 A1 | 9/2002 | Raaymakers | |
| 2003/0043714 A1 | 3/2003 | Takeda | |
| 2003/0048120 A1 * | 3/2003 | Chou | 327/165 |
| 2003/0067335 A1 | 4/2003 | Von Kaenel | |
| 2003/0081516 A1 | 5/2003 | Takumai et al. | |
| 2003/0081531 A1 | 5/2003 | Mashimo et al. | |
| 2003/0099180 A1 * | 5/2003 | Park et al. | 369/59.25 |
| 2003/0117915 A1 * | 6/2003 | Minamino et al. | 369/47.22 |
| 2003/0179665 A1 | 9/2003 | Iwazawa et al. | |
| 2004/0057360 A1 | 3/2004 | Banno | |
| 2004/0141577 A1 | 7/2004 | Brunn | |
| 2004/0178834 A1 | 9/2004 | Lee | |
| 2004/0213119 A1 | 10/2004 | Van Vlerken et al. | |
| 2005/0073923 A1 | 4/2005 | Tobita | |

FOREIGN PATENT DOCUMENTS

| | | |
|---|---|---|
| JP | 11-353686 | 12/1999 |
| TW | 509927 | 11/2002 |

* cited by examiner

WOBBLE CLOCK GENERATOR AND DRIVING METHOD THEREOF

BACKGROUND OF THE INVENTION

1. Field of the Invention

The present invention relates in general to a wobble clock generator and a related driving method, and more particularly, to a wobble clock generator and a related driving method having a protective mechanism capable of avoiding interference generated from a phase-modulated wobble signal.

2. Description of the Prior Art

Over the past few years, storage media have rapidly increased in storage capacity due to demand for storing a tremendous amount of information. Of all the various kinds of storage media, optical discs have features of a low-cost, small-size, low-error-rate, long-storage-time, and high-density storage medium and is the most promising dominant storage medium in the future. Generally speaking, optical disc drives are used to read information stored on an optical disc. Examples of optical disc drives are known as compact disc drives (CD-ROM drives) and digital versatile disc drives (DVD-ROM drives) in the prior art. Some optical disc drives have the additional capability of being able to write data onto an optical disc, i.e., CD-R/RW, DVD+R/RW and DVD-R/RW drivers. Optical disc drives are used in music and video playback and are implemented in recording devices and other electronic devices.

In order to effectively manage the information stored on a digital versatile disc, the data storage region of the digital versatile disc is divided into many frames. Data can be stored in these frames according to a memory format. Therefore, while in a writing process for a rewritable digital versatile disc, the DVD drive has to identify the memory format of the rewritable digital versatile disc before the writing process. In order to record the related information concerning the memory frames, there are special addressing structures on the rewritable digital versatile disc to record the related information. According to the specifications of a recordable or a rewritable digital versatile disc, the related information recorded in the addressing structures is known as the address in pre-groove (ADIP).

Figure 1:
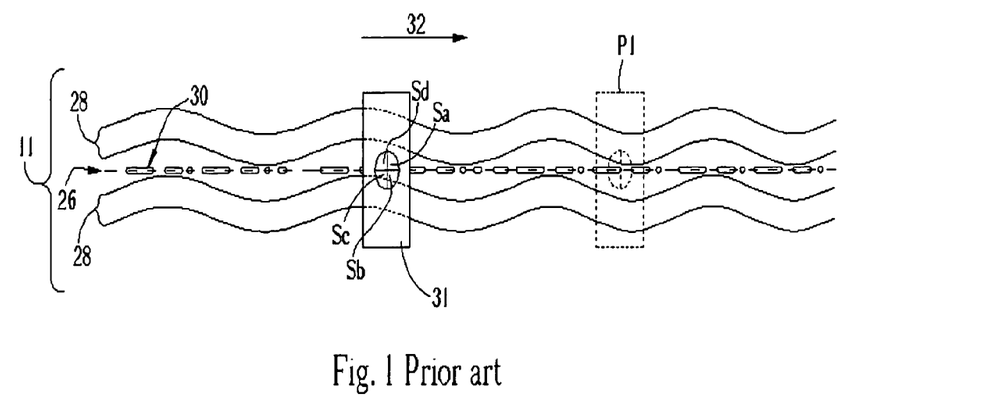
FIG. 1 is a schematic diagram showing a reading process on a reflecting surface of an optical disc by an optical pickup.

Please refer to FIG. 1. FIG. 1 is a schematic diagram showing a reading process on a reflecting surface of an optical disc by an optical pickup 31. On the reflecting surface of the optical disc, there is a fine spiral track 11 as is shown in FIG. 1. The fine track 11 is composed of two types of tracks, one being a data track 26 to record data, and the other being a wobble track 28 to record related addressing information of each frame.

As illustrated in the magnified view of FIG. 1, the data track 26 has an interrupt and discontinuity record mark 30, and the wobble track 28 has an oscillating shape. The surface of the wobble track 28 protrudes beyond the reflecting surface of the optical disc. The data track 26 is located inside a groove formed by the raised wobble track 28 as is shown in FIG. 1. The length of each record mark 30 varies, and the reflection characteristic of the record mark 30 is different from that of the other reflecting surface of the optical disc.

The optical pickup 31 comprises an optical receiver (not shown) for reading the data from the record mark 30 within the data track 26, and four optical sensors Sa, Sb, Sc, and Sd to extract tracking information from the wobble track 28. The positions of the sensors Sa and Sd in FIG. 1 are located on the groove area of the fine track 11 on the reflecting surface of the optical disc. However, the positions of the sensors Sb and Sc in FIG. 1 are located on the protruded area of the fine track 11.

As the optical disc rotates, the optical pickup 31 can be thought of as moving over the fine track 11 of the optical disc along the direction of arrow 32. The reflected laser beam intensities detected by the four sensors Sa, Sb, Sc, and Sd are different because of the difference in reflecting quality between the groove and the protruded area of the wobble track 28. As the optical pickup 31 moves along a straight path from the position shown to a position P1, the sensing values of the four sensors Sa, Sb, Sc, and Sd change. In other words, while the optical pickup 31 is located at the position P1, the positions of the sensors Sa and Sd are changed to be located on the protruded area of the fine track 11 and the positions of the sensors Sb and Sb are changed to be located on the groove area of the fine track 11.

By performing some well-known subtracting processes over the electrical sensing values of the four sensors Sa, Sb, Sc, and Sd, a wobble signal can be generated. Thereafter, the wobble signal can be utilized to generate an address in pre-groove (ADIP) through a decoding process.

It is well-known that the information of the ADIP is recorded in the wobble signal by a phase modulation technique, which means that the information is recorded according to the phase shift of a carrier. Every pair of record areas on an optical disc corresponds to 93 wobble periods, and 8 wobble periods of them are utilized to record an ADIP by phase modulation.

Figure 2:
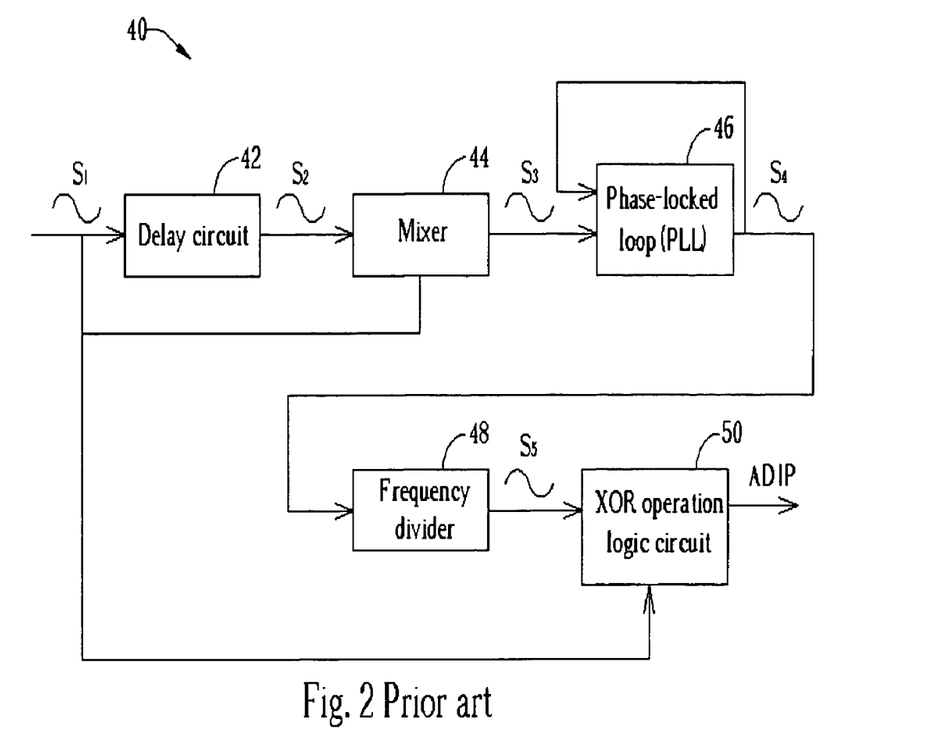
FIG. 2 is a functional block diagram of a prior art analog ADIP decoder.

As aforementioned, since the ADIP is recorded in the wobble signal by phase modulation, an ADIP decoder is required for the disc drive to extract the ADIP from an optical disc. Please refer to FIG. 2. FIG. 2 shows a functional block diagram of a prior art analog ADIP decoder 40. The ADIP decoder 40 comprises a delay circuit 42, a mixer 44, a phase-locked loop (PLL) 46, a frequency divider 48, and an XOR operation logic circuit 50.

First of all, the functional operation of the analog ADIP decoder is processed based on the following trigonometric expression.

$$\text{Sin}(.) * \text{Cos}(.) = \frac{1}{2} \text{Sin}(2.) \qquad \text{eq. (1)}$$

Wherein Sin(.) is used to describe the waveform of a wobble signal and Cos(.) is used to described the waveform of the other signal.

Therefore, if a phase shift of 180° of the wobble signal occurs, which means the corresponding waveform of the wobble signal becomes Sin(.+180°), another signal with a waveform of 0.5*Sin(2.+360°) is generated according to eq. (1). The waveform function 0.5*Sin(2.+360°) is actually equal to 0.5*Sin(2.). In other words, a non-phase-modulated wobble clock can be generated by a phase-modulated wobble signal. After the wobble clock is generated, the ADIP decoder is able to extract the ADIP based on the wobble signal in conjunction with the wobble clock.

As is shown in FIG. 2, the signal S1 is a wobble signal. A signal S2 is generated by performing a quarter period delay process on the signal S1 by the delayed circuit 42, which causes a phase difference of 90° between the signal S1 and the signal S2. If the waveform of the signal S1 corresponds to Sin(.), the corresponding waveform of the signal S2 becomes Sin(.+90°) which is actually equal to Cos(.). Thereafter, the signal S1 is multiplied by the signal S2 through the mixer 44 to generate a signal S3. As aforementioned, the waveform of the signal S3 then corresponds to the function 0.5*Sin(2.), which means the frequency of the signal S3 is twice as high as the frequency of the signal S1. With the help of the signal S3, the phase-locked loop 46 is able to generate a signal S4 which is synchronized with the signal S3. The waveform of the signal S4 also corresponds to the function Sin(2.). Next, the frequency divider 48 generates a signal S5 with half the frequency of the signal S4.

Since the signal S5 is a non-phase-modulated wobble clock and the signal S1 is a phase-modulated wobble signal, after an XOR operation is performed on the signal S1 and the signal S5 by the XOR operation logic circuit 50, an ADIP is extracted from the signal S1.

Because there is no analog differentiator to convert Sin(.) precisely into Cos(.), the delay circuit 42 is utilized to perform the conversion. However, if the rotating speed of the optical disc keeps changing, the frequency of the signal S1 also changes accordingly. Therefore, the delay circuit 42 is required to adjust the delay parameters according to the changing periods of the signal S1. Based on the functional demands described above, the delay circuit 42 becomes complicated and is hard to implement.

Figure 3:
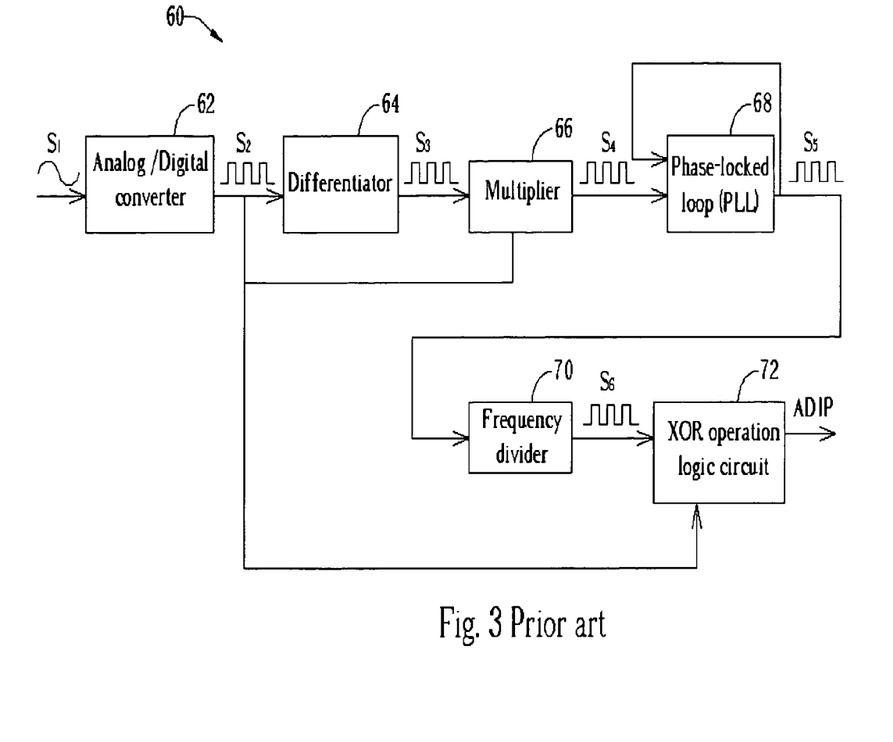
FIG. 3 is a functional block diagram of a prior art digital ADIP decoder.

Please refer to FIG. 3. FIG. 3 shows a functional block diagram of a prior art digital ADIP decoder 60. The ADIP decoder 60 comprises an analog-to-digital converter (ADC) 62, a differentiator 64, a multiplier 66, a PLL 68, a frequency divider 70, and an XOR operation logic circuit 72. In a similar way described before, based on the eq. (1), the digital ADIP decoder 60 is able to generate a wobble clock from a wobble signal and extract an ADIP from the wobble signal.

Because the signal S1 is an analog wobble signal, the analog-to-digital converter 62 is required to convert the analog signal S1 into a digital signal S2 for further digital signal processing. The differentiator 64 generates a signal S3 by performing a differentiating process on the signal S2. In other words, if the analog signal S1 corresponds to a function Sin(.), then the digital signal S2 should be a digital signal corresponding to the same function Sin (.) and the digital signal S3 should be a digital signal corresponding to the function Cos(.). Thereafter, the digital signal S2 is multiplied by the digital signal S3 through the multiplier 66 to generate a digital signal S4.

According to the eq. (1), the digital signal S4 corresponds to the function 0.5*Sin(2.), which means the frequency of the digital signal S4 is twice as high as the frequency of the digital signal S2. With the aid of the digital signal S4, the phase-locked loop 68 is able to generate a digital signal S5 which is synchronized with the digital signal S4. Consequently, the digital signal S5 also corresponds to the function Sin(2.). Thereafter, the frequency divider 70 generates a digital signal S6 with half the frequency of the digital signal S5.

Since the digital signal S6 corresponds to a non-phase-modulated wobble clock waveform and the digital signal S2 corresponds to a phase-modulated wobble signal, after an XOR operation is performed on the digital signal S2 and the digital signal S6 by the XOR operation logic circuit 72, an ADIP is extracted from the signal S2.

As aforementioned, the operation of the digital ADIP decoder 60 requires an analog-to-digital conversion and a digital differentiating process, which means the demand for ultra high speed operation of the circuits must be achieved to be integrated into a high-performance DVD drive. Furthermore, in order to achieve high resolution in the analog-to-digital converting process, higher bits per sampling signal data is another stringent requirement of the digital ADIP decoder 60 for a high-performance DVD drive. Again, because of the stringent requirements described above, the digital ADIP decoder 60 is actually a complicated and high-cost circuit for a high-performance DVD drive.

SUMMARY OF INVENTION

It is therefore a primary objective of the claimed invention to provide a wobble clock generator with a protective mechanism capable of avoiding interference generated from a phase-modulated wobble signal using a cost-effective and labor saving circuit design to solve the above-mentioned problem of the prior art wobble clock generator.

According to a preferred embodiment of the claimed invention, the wobble clock generator comprises an arithmetic/logic circuit and a phase-locked loop. The arithmetic/logic circuit is capable of calculating a period count value by counting a period of a wobble signal according to a reference clock, and is capable of comparing an average value with the period count value for outputting a control signal. The phase-locked loop is electrically connected to the arithmetic/logic circuit for generating a wobble clock according to the control signal and the wobble signal. When the control signal corresponds to a first logic level, the phase-locked loop compares the wobble signal with the wobble clock to drive the wobble clock to be synchronized with the wobble signal. When the control signal corresponds to a second logic level, the phase-locked loop holds the wobble signal without driving the wobble clock to be synchronized with the wobble signal.

According to a preferred method of the claimed invention, a non-phase-modulated wobble clock is generated according to a phase-modulated wobble signal. The method for generating the wobble clock comprises calculating a period count value by counting a period of a wobble signal according to a reference clock, comparing an average value with the period count value for outputting a control signal, generating a wobble clock according to the control signal and the wobble signal, comparing the wobble signal with the wobble clock to drive the wobble clock to be synchronized with the wobble signal when the control signal corresponds to a first logic level, and holding the wobble signal without driving the wobble clock to be synchronized with the wobble signal when the control signal corresponds to a second logic level.

As a result, whatever the drifting of the phase-modulated wobble signal, the wobble clock generator of the claimed invention is able to generate the non-phase-modulated wobble clock dynamically according to the phase-modulated wobble signal. Besides, the circuit design of the wobble clock generator of the claimed invention is relatively simple and easy to implement, which means the wobble clock generator is a cost-effective circuit for any DVD+R disc drive or DVD+RW disc drive.

These and other objectives of the claimed invention will no doubt become obvious to those of ordinary skill in the art after reading the following detailed description of the preferred embodiment that is illustrated in the various figures and drawings.

DETAILED DESCRIPTION

Figure 4:
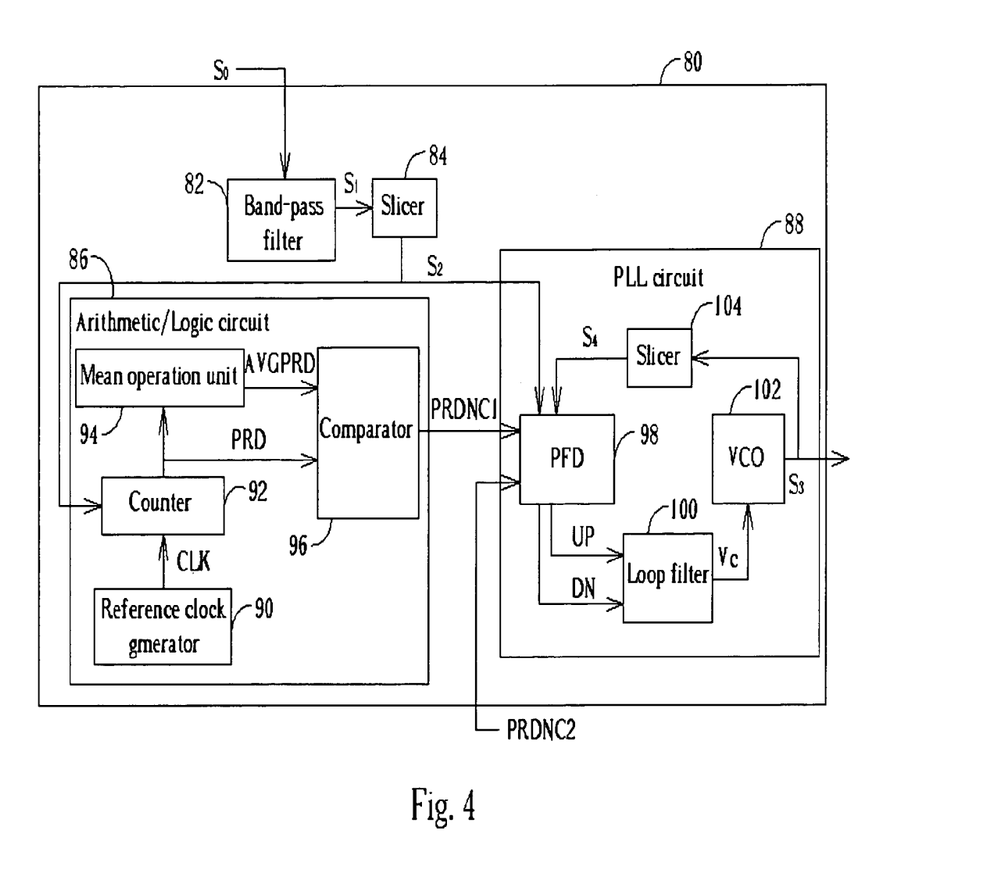
FIG. 4 is a functional block diagram of a wobble clock generator according to one preferred embodiment of the claimed invention.

Please refer to FIG. 4. FIG. 4 shows a functional block diagram of a wobble clock generator 80 according to one preferred embodiment of the claimed invention. The wobble clock generator 80 comprises a band-pass filter (BPF) 82, a slicer 84, an arithmetic/logic circuit 86, and a phase-locked loop (PLL) 88. The arithmetic/logic circuit 86 comprises a reference clock generator 90, a counter 92, a mean operation unit 94, and a comparator 96. The phase-locked loop 88 comprises a phase-frequency detector (PFD) 98, a loop filter 100, a voltage-controlled oscillator (VCO) 102, and a slicer 104. The wobble clock generator 80 can be applied to a DVD+R disc drive or a DVD+RW disc drive. According to the specifications of a DVD+R disc drive or a DVD+RW disc drive, the ADIP is recorded in the corresponding phase-modulated wobble signal. For that reason, a non-phase-modulated wobble clock is required to decode the ADIP. Consequently, the wobble clock generator 80 is utilized to generate the non-phase-modulated wobble clock S3 from the phase-modulated wobble signal S0 as is shown in FIG. 4. According to the preferred embodiment, the quality factor (Q factor) of the band-pass filter 82 is required to be high enough to process a sharp band-pass filtering of S0 and generate a signal S1. Furthermore, in the process of the preferred embodiment performed by the band-pass filter 82 on the phase-modulated period of the wobble signal S0, a phase lag and a frequency drifting phenomena occur on the signal S1. After the signal S1 is generated, the slicer 84 is utilized to convert the signal S1 having a sinusoidal waveform into a signal S2 having a square waveform. The signal S2 output from the slicer 84 is then forwarded to both the arithmetic/logic circuit 86 and the phase-locked loop 88.

Concerning the circuit operation of the phase-locked loop 88, the phase-frequency detector 98 compares the frequency and phase differences between the signal S2 and the signal S4 and outputs a control signal UP and a control signal DN. When the control signal UP and the control signal DN is forwarded to the loop filter 100, the loop filter 100 is able to generate a DC control voltage Vc for the voltage-controlled oscillator 102 according to the control signal UP and the control signal DN. Traditionally, there are charge pump circuits incorporated in the loop filter 100 to alter the DC control voltage Vc. In other words, with the aid of the charge pump circuits, the loop filter 100 is able to increase the DC control voltage Vc while receiving the control signal UP and to decrease the DC control voltage Vc while receiving the control signal DN. Besides, the loop filter 100 normally comprises a low-pass filter to stabilize the DC control voltage. Thereafter, the voltage-controlled oscillator 102 is capable of generating a signal S3 according to the DC control voltage Vc. Furthermore, the slicer 104 performs a waveform slicing process to convert the signal S3 having a sinusoidal waveform into a signal S4 having a square waveform. The signal S4 having a square waveform is then fed back to the phase-frequency detector 98. As is described above, the phase-locked loop 88 is able to correct the frequency and phase errors through a feedback mechanism until the signal S4 is in phase with the signal S2.

For instance, if a rising edge of the signal S4 occurs before a corresponding rising edge of the signal S2, the phase-frequency detector 98 is triggered to generate a control signal DN to decrease the DC control voltage Vc by the loop filter 100, which in turn will decrease the frequency of the signal S3 and delay the occurrence of the rising edge of the signal S4. Thereby, a correcting process for the signal S4 having a phase leading over the signal S2 proceeds until the rising edges of the signal S4 and the signal S2 occur simultaneously. On the contrary, if a rising edge of the signal S4 occurs after a corresponding rising edge of the signal S2, the phase-frequency detector 98 is triggered to generate a control signal UP to increase the DC control voltage Vc with the loop filter 100, which in turn will increase the frequency of the signal S3 and advance the occurrence of the rising edge of the signal S4. Thereby, a correcting process for the signal S4 having a phase lagging over the signal S2 proceeds until the rising edges of the signal S4 and the signal S2 occur simultaneously. However, during the correcting process of S4, the phase relationship between the signal S4 and the signal S2 may switch between a leading and a lagging, consequently a feedback mechanism based on the two aforementioned correcting processes is utilized to correct the phase and frequency of the signal S4 at any moment.

When the signal S4 and the signal S2 are in phase, which means the rising edges of the signal S4 and the signal S2 occur simultaneously to trigger the phase-frequency detector 98 to generate both the control signal UP and the control signal DN, the triggered durations of the control signal UP and the control signal DN are the same and the DC control voltage Vc of the phase-locked loop 88 remains unchanged for holding the signal S3.

According to the well-known specifications of the DVD+R optical drive and the DVD+RW optical drive, the information of an ADIP is recorded in the wobble signal. An ADIP unit corresponds to 93 wobble periods and 8 wobble periods of them are utilized to record an ADIP sync unit or an ADIP data unit by phase modulation. The other 85 wobble periods are not phase modulated to record any information. In other words, the 8 phase-modulated wobble periods are able to pose some effect on the signal S2 and the frequency of the signal S2 becomes unstable. If the phase-locked loop 88 controls the frequency and phase of the signal S3 based on the signal S2 having an unstable frequency, the frequency of the signal S3 generated is also unstable. For instance, when the phase-locked loop 85 has finished the operation over the signal S3 for holding the signal S3 having correct phase and correct frequency in the duration of the 85 non-phase-modulated wobble periods and proceeds to perform a decoding process over the signal S1, the input of the subsequently 8 phase-modulated wobble periods to the wobble clock generator 80 is able to cause an error operation of the phase-locked loop 88 and which in turn will bias the frequency and phase of the signal S3 from the desired values. Under such circumstance, the wobble clock generator 80 is not able to output a stable signal S3 persistently. More to the point, if both the frequency and phase of the signal S3 drift significantly from the desired values, a longer duration for the phase-locked loop 88 to relock the desired signal S3 is required. Accordingly, the performance of the phase-locked loop 88 degrades.

Therefore, the purpose of the arithmetic/logic circuit 86 according to the claimed invention is to provide a protective mechanism capable of avoiding the process of driving the signal S3 to be synchronized with the signal S2 while receiving an unstable signal S2 in the corresponding phase-modulating duration. The reference clock generator 90 is utilized to generate a reference clock CLK having a predetermined frequency, for example 33 MHz.

The counter 92 is utilized to calculate a period count value PRD through counting the rising or falling edge triggering times of the counter 92 by the reference clock CLK within one period of the signal S2. In other words, the counter 92 is used to evaluate the number of periods of the reference clock CLK corresponding to one period of the signal S2. By this means, the counter 92 is able to determine the duration of one period of the signal S2 by the period count value PRD. The mean operation unit 94 receives a plurality of the consecutive period count values PRD corresponding to the signal S2 from the counter 92 and calculates an average value AVGPRD based on the plurality of the consecutive period count values PRD. For instance, the mean operation unit 94 may calculate an average value AVGPRD based on every 16 consecutive period count values PRD. The period count value PRD generated by the counter 92 is then forwarded to both the mean operation unit 94 and the comparator 96.

The comparator 96 according to the preferred embodiment is employed to compare the period count value PRD with the average value AVGPRD and determines whether the signal S2 is in a frequency-unstable state, which means whether the phase-modulated period is forwarded to the wobble clock generator 80. Based on the comparison between the period count value PRD and the average value AVGPRD, the comparator 96 generates a control signal PRDNC1 and forwards the control signal PRDNC1 to the phase-frequency detector 98. If the signal S2 is in a frequency-unstable state, the control signal PRDNC1 is able to prohibit the phase-frequency detector 98 from outputting the control signals UP and DN. Thereafter, since neither of the control signal UP and DN are received by the loop filter 100, the DC control voltage Vc is held unchanged, which causes the voltage-controlled oscillator 102 to hold the signal S3. As a result, the phase-locked loop 88 is not going to drive the signal S3 to be synchronized with the signal S2 under frequency-unstable circumstances of the signal S2.

Based on the above description, when the phase-modulated periods of the signal S0 are forwarded to the wobble clock generator 80 and frequency-unstable circumstances of the signal S2 occur, the arithmetic/logic circuit 86 of the preferred embodiment is able to output a control signal PRDNC1 to prohibit the phase-locked loop 88 from driving the signal S3 to be synchronized with the signal S2. The situation proceeds until the non-phase-modulated periods of the signal S0 are forwarded to the wobble clock generator 80 and frequency-stable circumstances of the signal S2 occur. As the non-phase-modulated periods of the signal S0 are forwarded to the wobble clock generator 80, the arithmetic/logic circuit 86 resets the control signal PRDNC1 so that the phase-frequency detector 98 is able to output the control signals UP and DN to the loop filter 100 and the phase-locked loop 88 is able to drive the signal S3 to be synchronized with the signal S2.

Figure 5:
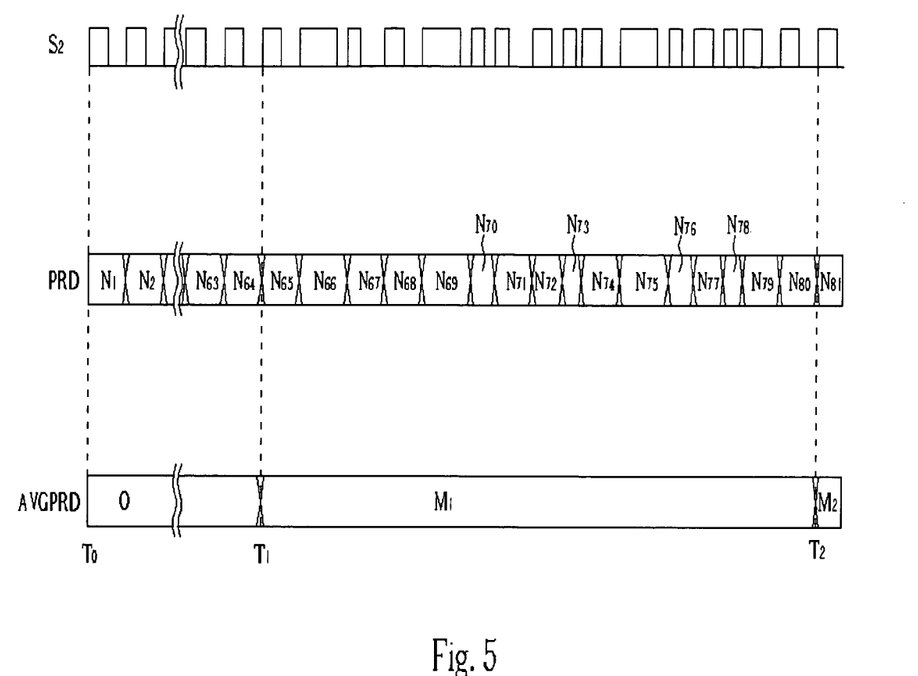
FIG. 5 is a diagram of schematic waveforms of the signal S2, the period count value PRD, and the average value AVG-PRD.

Please refer to FIG. 5. FIG. 5 is a diagram of schematic waveforms of the signal S2, the period count value PRD, and the average value AVGPRD, which are actually the operating clock waveforms related to the counter 92 and the mean operation unit 94. As aforementioned, the signal S1 is generated by the band-pass filter 82 from the wobble signal S0 pickup through an optical disc. Furthermore, the slicer 84 converts the signal S1 having a sinusoidal waveform into the signal S2 having a square waveform. As the phase-modulated periods of the signal S0 are processed by the band-pass filter 82 having a high quality factor, frequency-unstable circumstances of the signal S2 may occur.

As is shown in FIG. 5, after the time T1, due to the effect of the phase-modulated periods of the signal S0, the frequency of the signal S2 becomes unstable. Furthermore, the counter 92 calculates the corresponding period count value PRD with the aid of the reference clock CLK of reference clock generator 90 within one period of the signal S2. Generally, the frequency of the reference clock CLK is required to be higher than the average frequency of the signal S2 so as to calculate the corresponding period count value PRD for each period of the signal S2. For instance, according to the preferred embodiment, the reference clock CLK having a frequency of 33 MHz or 26.16 MHz is used to calculate the corresponding period count value PRD for each period of the signal S2 having an average frequency of about 817.5 KHz.

As the operation of the arithmetic/logic circuit 86 is initiated, there is no counting value for the period count value PRD and the mean operation unit 94 is required to set an initial value, 0 for example, to the average value AVGPRD. In addition, when the comparator 96 receives an average value AVGPRD which corresponds to the initial value, the comparator 96 will cease the comparison process for the period count value PRD and the average value AVGPRD.

According to the preferred embodiment of the claimed invention, after the counter 92 completes counting the initial 64 period count values PRD corresponding to 64 periods of the signal S2, the mean operation unit 94 is able to calculate an initial average value AVGPRD, which is M1 in FIG. 5, by averaging the initial 64 period count values PRD, which is shown in FIG. 5 for a plurality of the period count values PRD ranging from N1 to N64. The initial calculating process for the initial average value AVGPRD on the mean operation unit 94 can be expressed by the following formula:

$$M1 = \left(\sum_{i=1}^{64} Ni\right) / 64$$

Thereafter, when the counter 92 has finished counting another 16 period count values PRD corresponding to the subsequent 16 periods of the signal S2 after the time T1, the mean operation unit 94 will calculate another average value AVGPRD, which is M2 in FIG. 5, by averaging the subsequent 16 period count values PRD after the time T1, which is shown in FIG. 5 for a plurality of the period count values PRD ranging from N65 to N80. Thereby, a normal calculating process for the average value AVGPRD on the mean operation unit 94 is then expressed by the following formula:

$$M2 = \left(\sum_{i=65}^{80} Ni\right) / 16$$

In the same way, after the time T2, every time the counter 92 has finished another 16 period count values PRD corresponding to another 16 periods of the signal S2, the mean operation unit 94 will calculate another average value AVGPRD based on the preceding 16 period count values PRD.

In order to work out an initial average value M1 which is close to the normal average value M2 corresponding to the non-phase-modulated periods of the signal S2, more period count values PRD, 64 for example, are used by the mean operation unit 94 to calculate the initial average value M1. Therefore, according to the preferred embodiment of the claimed invention, as aforementioned, the initial counting process of the average value AVGPRD is different from the normal counting process of the average value AVGPRD, which reduces the effect caused by the phase-modulated periods of the signal S2 as is described before. For instance, there are 93 wobble periods corresponding to an ADIP unit, and 8 wobble periods of them are phase modulated to record the information of an ADIP and the other 85 wobble periods are not phase modulated. As aforementioned, the mean operation unit 93 calculates the initial average value M1 based on 64 period count values corresponding to 64 wobble periods of the signal S2. If the 8 phase-modulated wobble periods are included in the 64 wobble periods, the 8 period count values corresponding to the 8 phase-modulated wobble periods will bias the calculation of the mean operation unit 94, which causes the initial average value to deviate from the normal average value. However, there are still 56 period count values corresponding to the 56 non-phase-modulated wobble periods, which is able to reduce the effect of the 8 phase-modulated wobble periods and drive the initial average value to be close to the normal value. In other words, the deviation of the initial average value generated according to the preferred embodiment from the normal average value is not significant.

Based on the calculating process described above, as the mean operation unit 94 calculates the initial average value M1 with more period count values, the comparator 96 is able to determine whether there is any corresponding phase-modulated period enclosed in the following 16 periods of the signal S2 with the aid of the desired initial average value M1. Similarly, after the time T1, every time the counter 92 has finished another 16 period count values PRD corresponding to another 16 periods of the signal S2, the mean operation unit 94 will calculate another average value AVGPRD based on the preceding 16 period count values PRD. If there are 8 period count values PRD corresponding to the phase-modulated wobble periods of the signal S2 enclosed in the preceding 16 period count values PRD, the 8 period count values PRD corresponding to the 8 phase-modulated wobble periods of the signal S2 are capable of driving the average value to deviate from the normal average value. However, there are still 8 period count values corresponding to the 8 non-phase-modulated wobble periods, which is able to reduce the effect of the 8 phase-modulated wobble periods and drive the average value to be close to the normal value. Therefore, after the average operation over the 16 period count values PRD, the average value M1 is not going to deviate from the normal average value significantly. Please note that the numbers of the period count values utilized to calculate the average values according to the above-mentioned embodiment are only given as examples and should not be taken as a limitation.

Figure 6:
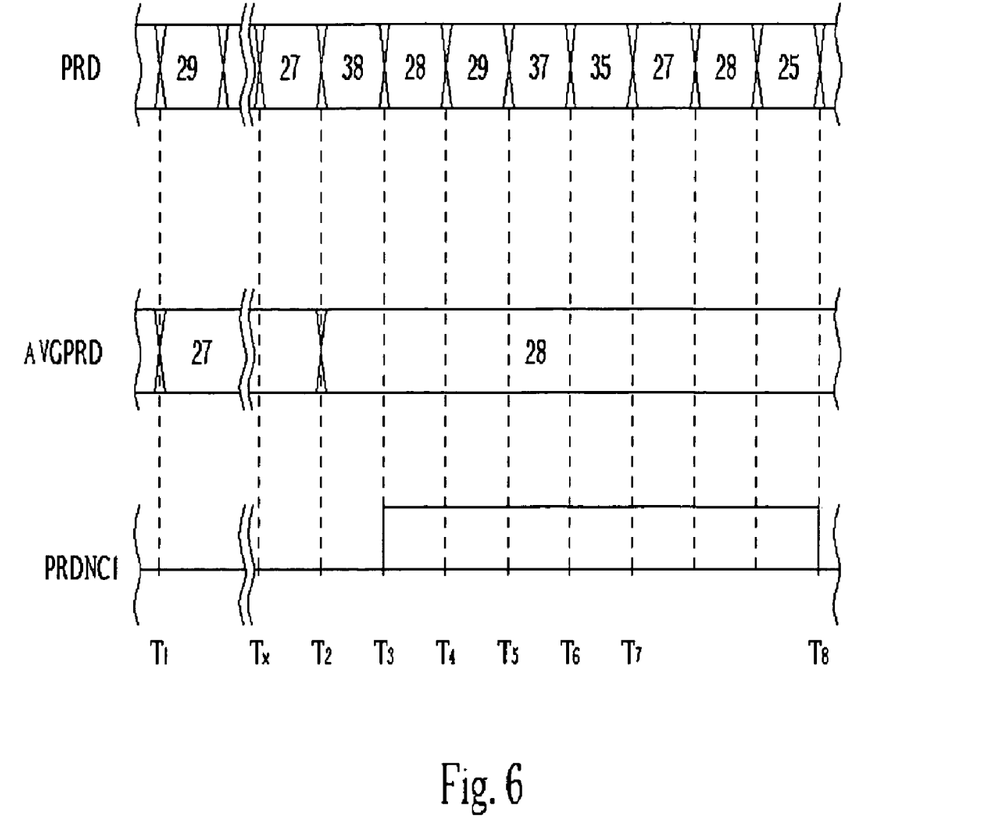
FIG. 6 is a diagram of schematic waveforms of the period count value PRD, the average value AVGPRD, and the control signal PRDNC1.

Please refer to FIG. 6. FIG. 6 is a diagram of schematic waveforms of the period count value PRD, the average value AVGPRD, and the control signal PRDNC1, which are actually the operating clock waveforms related to the comparator 96 shown in FIG. 4. While generating the wobble signal by reading the information of the wobble track on an optical disc, owing to the variation of the rotating speed of the spindle motor of the disc drive or any vibration caused by the disc eccentricity, the variation of the generated wobble signal occurs. Thereby, the mean operation unit 94 is required to compare the current period count value PRD with the preceding average value AVGPRD and calculate the difference between the current period count value PRD with the preceding average value AVGPRD. Furthermore, the mean operation unit 94 is able to determine whether the difference is larger than a critical value, which actually involves determining whether the current period count value PRD is under the effect of a phase-modulated wobble period.

For instance, the critical value can be set to a quarter or an eighth of the preceding average value AVGPRD. Thus, if the difference is larger than a quarter or an eighth of the AVGPRD, the comparator 96 will output a control signal PRDNC1 to prohibit the phase-frequency detector 98 from outputting the control signals UP and DN.

For the sake of clarity, the signals of the period count value PRD and the average value AVGPRD in FIG. 6 are shown in a series of decimal numbers, and the critical value is predetermined to an eighth of the preceding average value AVGPRD. Therefore, the difference between the period count value PRD and the average value AVGPRD is less than the critical value during the time ranging from T1 to T2, and the control signal PRDN1 is not triggered and holds a low level signal. Furthermore, the mean operation unit 94 recalculates an average value AVGPRD, which equals 28 shown in FIG. 6, and the critical value is reset to be 4 at a time T2. However, during the time ranging from T1 to T2, the period count value PRD generated by the counter 92 equals 38, and the current difference between the period count value PRD and the average value AVGPRD exceeds the critical value. Thereby, after a comparing process performed by the comparator 96 over the period count value PRD and the average value AVGPRD at a time T3, the comparator 96 is triggered to switch the control signal PRDNC1 from a low level signal to a high level signal, which causes the phase-frequency detector 98 to stop outputting the control signals UP and DN at the same time.

In general, as the band-pass filter 84 receives the phase-modulated periods of the signal S0, the frequency of the signal S1 becomes unstable. Although there are only 8 phase-modulated periods enclosed in each 93 periods of the signal S0, as the following 85 non-phase-modulated periods of the signal S0 are processed by the band-pass filter 82, the frequency of the signal S1 is still unstable for some time due to the operation characteristics of the band-pass filter 82. In other words, the duration of the unstable situation is actually longer than the expected duration of the 8 phase-modulated periods of the signal S0 and is hard to predict. Consequently, as the frequency of the signal S1 is unstable due to the signal processing of the signal S0 by the band-pass filter 82, the period count value PRD generated by the counter 92 corresponding to a period of the signal S2 may still be close to the average value AVGPRD. Under such circumstance, the recovery of the frequency-stable situation misjudged by the comparator 96 may reset the control signal PRDNC1 from the high level signal to the low level signal and drive the signal S3 to be synchronized with the signal S2 under frequency-unstable circumstances of the signal S2.

As a result, based on the unwanted situations described above, the comparator 96 according to the claimed invention resets the control signal PRDNC1 from the high level signal to the low level signal only when the differences between a plurality of consecutive period count values PRD and the average value AVGPRD are all less than a predetermined critical value. Thereby, the occurrence of an error resetting process of the control signal PRDNC1 is reduced significantly.

As is shown in FIG. 6, the comparator 96 resets the control signal PRDNC1 from the high level signal to the low level signal only when the differences between 3 consecutive period count values PRD and the average value AVGPRD are all less than a predetermined critical value. Therefore, after the control signal PRDNC1 is set to a high level signal at a time T3, although the differences between the period count values PRD and the average values AVGPRD are all less than the critical value during the time ranging from T3 to T5, the frequency of the signal S1 is still unstable and the control signal PRDNC1 still holds a high level signal. The situation holds until the differences between 3 consecutive period count values PRD and the average value AVGPRD are all less than a predetermined critical value at a time T8, and the control signal PRDNC1 is reset to a low level signal.

According to the aforementioned preferred embodiment, as the rotating speed of the spindle motor of the disc drive is changing, the average value AVGPRD is changing accordingly. However, there are other alternative processes used for the comparator 96 to calculate the average value AVGPRD. For instance, when an optical disc rotates with a constant angular velocity or a constant linear velocity, the corresponding linear velocity of the optical pickup relative to the optical disc can be calculated based on the rotating speed of the spindle motor of the disc drive. In other words, the frequency of the wobble signal can be calculated accordingly. For instance, if the optical disc is rotating with an 1× speed, the frequency of the wobble signal can be calculated to be about 817.5 KHz. Consequently, the average value AVGPRD can be calculated based on the frequency of the wobble signal and the frequency of the reference clock CLK. Please note that all the above-mentioned processes to calculate the average values AVGPRD are included in the claimed invention.

As is shown in FIG. 4, although the signal S2 is forwarded to both the phase-frequency detector 98 and the arithmetic/logic circuit 86, the signal S2 has to go through the counter 92 and the comparator 96 so as to generate a control signal PRDNC1 required by the phase-frequency detector 98. In other words, before the control signal PRDNC1 corresponding to the signal S2 is generated, there is a time delay caused by a counting process of the counter 92, an averaging process of the mean operation unit 94, and a comparing process of the comparator 96. Therefore, the timing for the arithmetic/logic circuit 86 to output the control signal PRDNC1 is preceded by the timing for the phase-frequency detector 98 to receive the signal S2. That is to say, before the control signal PRDNC1 having a high level signal is forwarded to the phase-frequency detector 98 to stop outputting the control signals UP and DN, the signal S3 has been driven to be synchronized with the signal S2 under frequency-unstable circumstances of the signal S2.

In order to solve the above-mentioned problem, another wobble clock generator 80 of the claimed invention with a protective mechanism is provided and detailed hereafter. As aforementioned, according to the well-known specifications of the DVD+R optical drive and the DVD+RW optical drive, an ADIP unit corresponds to 93 wobble periods and 8 wobble periods of them are utilized to record an ADIP sync unit or an ADIP data unit by phase modulation. The other 85 wobble periods are not phase modulated to record any information. The 85 non-phase-modulated wobble periods enclosed in the phase-modulated signal S0 are then utilized to generate the non-phase-modulated signal S3. Thereafter, a decoding process based on an XOR operation is performed on the non-phase-modulated wobble signal and the phase-modulated signal to generate an ADIP. With the aid of the signal S3 generated by the wobble clock generator 80 of the claimed invention, an ADIP can be generated from the corresponding 8 wobble periods in an ADIP unit. According to the specifications of the DVD+R optical drive and the DVD+RW optical drive, the subsequent 85 wobble periods should be in phase with the signal S3. Thereby, if an ADIP is decoded with the aid of the signal S3, the signal S3 is actually the desired wobble clock generated by the wobble clock generator 80. As a result, the beginning timing of the subsequent ADIP unit can be predicted, and the timing for the 8 phase-modulated wobble periods to input to the phase-locked loop 88 is preceded by the timing for the phase-frequency detector 98 to stop outputting the control signals UP and DN with a predetermined time interval.

Figure 7:
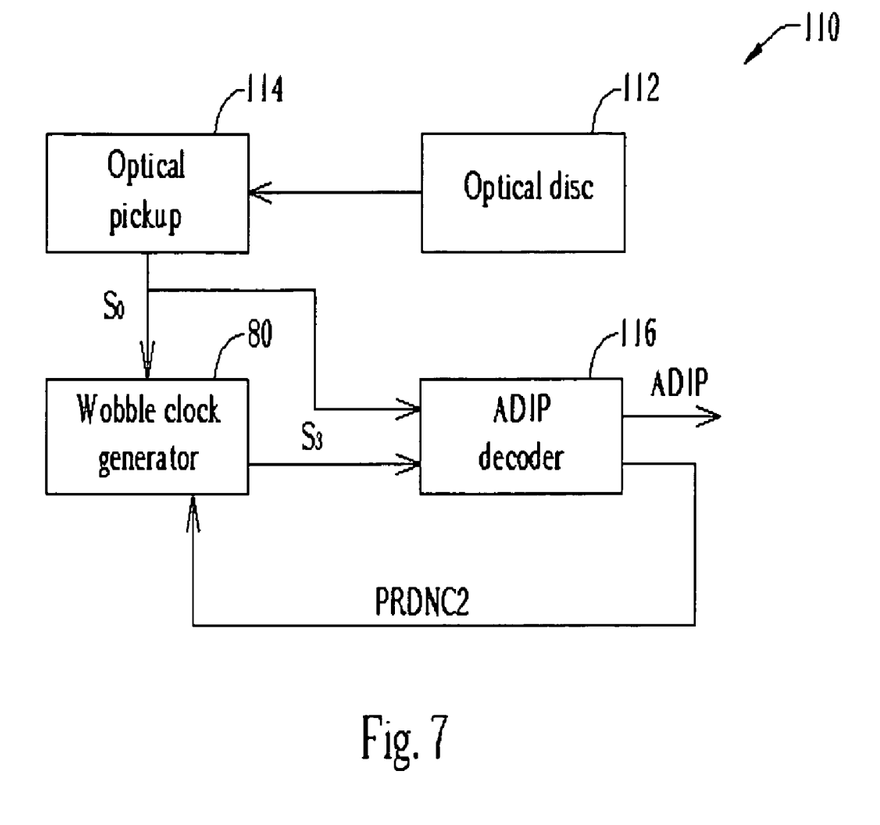
FIG. 7 is a functional block diagram of an optical disc access system according to one preferred embodiment of the claimed invention.

Please refer to FIG. 7. FIG. 7 is a functional block diagram of an optical disc access system 110 according to another preferred embodiment of the claimed invention. The optical disc access system 110 comprises an optical disc 112, an optical pickup 114, a wobble clock generator 80, and an ADIP decoder 116. The optical pickup 114 is able to fetch a phase-modulated wobble signal, i.e. S0, from the wobble track on the reflecting surface of the optical disc 112. As aforementioned, the wobble clock generator 80 is utilized to generate a non-phase-modulated wobble signal, i.e. S3, based on the phase-modulated signal S0, and an ADIP carried by the signal S0 is decoded with the aid of the signal S3 by the ADIP decoder 116. In other words, the ADIP can be decoded by performing an XOR operation on the signal S3 and the signal S0, and each ADIP corresponds to each 93 wobble periods. Since there are 85 non-phase-modulated wobble periods preceded by the 8 phase-modulated wobble periods, the ADIP decoder 116 is able to predict the timing for the input of the first wobble period of the signal S0 in the decoding process. Furthermore, because a phase shift of 180° occurs at the first wobble period, the timing for generating the control signal PRDNC1 based on the signal S2 by the arithmetic/logic circuit 86 shown in FIG. 4 lags the timing of the input of the first wobble period of the signal S2 to the phase-locked loop 88, which causes an error process to be performed on the signal S3 as described above.

Therefore, according to the preferred embodiment shown in FIG. 7 and FIG. 4, after a plurality of the ADIP units are decoded by the ADIP decoder 116 based on the signal S3 generated by the phase-locked loop 88, the ADIP decoder 116 is able to predict the timing for the input of the first wobble period corresponding to the next ADIP unit and generates a control signal PRDNC2. The control signal PRDNC2 is forwarded to the phase-frequency detector 98 and functions similar to the control signal PRDNC1 to stop outputting the control signals UP and DN at a predetermined time before the input of the first wobble period corresponding to the next ADIP unit. Furthermore, in the same way described above, when the differences between a plurality of the consecutive period count values PRD and the average values AVGPRD are all less than the critical value, both the control signals PRDNC1 and PRDNC2 are reset.

Compared to the prior art, the wobble clock generator of the claimed invention is capable of avoiding interference from a phase-modulated wobble clock by a protective mechanism. Furthermore, the circuit design of the wobble clock generator is relatively simple and easy to implement, which means the wobble clock generator is a cost-effective circuit for any DVD+R disc drive or DVD+RW disc drive.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A clock generator being applied to a DVD optical drive for generating a non-phase-modulated target clock signal based on a phase-modulated input signal, the clock generator comprising:

an arithmetic/logic circuit for calculating a period count value by counting a period of the input signal according to a reference clock having a predetermined frequency, calculating an average period value by averaging a plurality of the period count values, and comparing the average period value with the period count value for outputting a first control signal; and a phase-locked loop connected to the arithmetic/logic circuit for generating the target signal according to the first control signal and the input signal, feeding the target signal back to the input of the phase-locked loop, and determining whether the target clock signal is to be synchronized with the input signal based on a logic level of the first control signal, the phase-locked loop comprising:

a phase-frequency detector connected to the arithmetic/logic circuit configured to generate a second control signal by comparing the target clock signal with the input signal and to determine whether the second control signal is outputted according to the logic level of the first control signal;

a loop filter connected to the phase-frequency detector configured to generate a control voltage based on the second control signal; and a voltage-controlled oscillator connected to the loop filter configured to control the frequency of the target clock signal based on the control voltage;

wherein when the first control signal corresponds to a first logic level, the phase-locked loop compares the target clock signal with the input signal to drive the target clock signal to be synchronized with the input signal, and when the first control signal corresponds to a second logic level, the phase-locked loop holds the target clock signal without driving the target clock signal to be synchronized with the input signal.

2. The clock generator of claim 1, wherein the arithmetic/logic circuit comprises:

a reference clock generator for generating the reference clock having a predetermined frequency;

a counter connected to the reference clock generator for calculating the period count value by counting a period of the input signal according to the reference clock;

a mean operation unit connected to the counter for calculating an average period value by averaging a plurality of the period count values; and a comparator connected to the counter and the mean operation unit for comparing the period count value with the average period value.

3. The clock generator of claim 1, wherein the phase-locked loop further comprises a slicer connected to the phase-frequency detector and the voltage-controlled oscillator for slicing the target clock signal.

4. The clock generator of claim 1, wherein the loop filter comprises a charge pump circuit for controlling the control voltage based on the second control signal.

5. The clock generator of claim 1, wherein when the difference between the period count value and the average period value is less than a critical value, the first control signal is set to a first logic level.

6. The clock generator of claim 1, wherein when the differences between a plurality of the consecutive period count values and the average period value are all less than a critical value, the first control signal is set to a first logic level.

7. The clock generator of claim 1, wherein when the difference between the period count value and the average period value is larger than a critical value, the first control signal is set to a second logic level.

8. The clock generator of claim 1, wherein when the differences between a plurality of the consecutive period count values and the average period value are all larger than a critical value, the first control signal is set to a second logic level.

9. The clock generator of claim 1, wherein the clock generator further comprises:

a band-pass filter for extracting the input signal having a frequency within a predetermined band; and a slicer connected to the band-pass filter for slicing the input signal and forwarding the input signal to the arithmetic/logic circuit and the phase-locked loop.

10. The clock generator of claim 1, wherein the optical drive is a DVD-R optical drive or a DVD-RW optical drive, the optical drive comprising an ADIP decoder for predicting a timing for the input of the first period corresponding to the next ADIP unit of the input signal and generating a second control signal to prohibit the phase-locked loop from driving the target clock signal to be synchronized with the input signal at a predetermined time before the timing of the input of the first period corresponding to the next ADIP unit of the input signal.

11. A clock generator being applied to a DVD optical drive for generating a non-phase-modulated target clock signal based on a phase-modulated input signal, the clock generator comprising:

a means for calculating a period count value by counting a period of the input signal according to a reference clock having a predetermined frequency, calculating an average period value by averaging a plurality of the period count values, and comparing the average period value with the period count value for outputting a first control signal; and a means for generating the target signal according to the first control signal and the input signal, feeding the target signal back to the input of the means for generating the target signal, and determining whether the target clock signal is to be synchronized with the input signal based on a logic level of the first control signal, the means for generating the target signal comprising:

a means for generating a second control signal by comparing the target clock signal with the input signal, and for determining whether the second control signal is outputted according to the logic level of the first control signal;

a means for generating a control voltage based on the second control signal; and a means for controlling the frequency of the target clock signal based on the control voltage;

wherein when the first control signal corresponds to a first logic level, the means for generating the target signal compares the target clock signal with the input signal to drive the target clock signal to be synchronized with the input signal, and when the first control signal corresponds to a second logic level, the means for generating the target signal holds the target clock signal without driving the target clock signal to be synchronized with the input signal.

12. The clock generator of claim 11, wherein the means for calculating a period count value comprises:

a means for generating the reference clock having a predetermined frequency;

a means for calculating the period count value by counting a period of the input signal according to the reference clock;

a means for calculating an average period value by averaging a plurality of the period count values; and a means for comparing the period count value with the average period value.

13. The clock generator of claim 11, wherein the means for generating the target signal further comprises a means for slicing the target clock signal.

14. The clock generator of claim 11, wherein the means for generating a control voltage comprises a means for controlling the control voltage based on the second control signal.

15. The clock generator of claim 11, wherein when the difference between the period count value and the average period value is less than a critical value, the first control signal is set to a first logic level.

16. The clock generator of claim 11, wherein when the differences between a plurality of the consecutive period count values and the average period value are all less than a critical value, the first control signal is set to a first logic level.

17. The clock generator of claim 11, wherein when the difference between the period count value and the average period value is larger than a critical value, the first control signal is set to a second logic level.

18. The clock generator of claim 11, wherein when the differences between a plurality of the consecutive period count values and the average period value are all larger than a critical value, the first control signal is set to a second logic level.

19. The clock generator of claim 11, wherein the clock generator further comprises:

a means for extracting the input signal having a frequency within a predetermined band; and a means for slicing the input signal and forwarding the input signal to the means for calculating a period count value and the means for generating the target signal.

20. The clock generator of claim 11, wherein the optical drive is a DVD-R optical drive or a DVD-RW optical drive, the optical drive comprising means for predicting a timing for the input of the first period corresponding to the next ADIP unit of the input signal and generating a second control signal to prohibit the means for generating the target signal from driving the target clock signal to be synchronized with the input signal at a predetermined time before the timing of the input of the first period corresponding to the next ADIP unit of the input signal.

* * * * *